United States Patent
Lovejoy

(10) Patent No.: US 6,822,254 B1
(45) Date of Patent: Nov. 23, 2004

(54) NON-VOLATILE MEMORY CELL

(76) Inventor: Michael L. Lovejoy, 39 Tierra Monte NE., Albuquerque, NM (US) 87122

( * ) Notice: Subject to any disclaimer, the term of this patent is extended or adjusted under 35 U.S.C. 154(b) by 0 days.

(21) Appl. No.: 10/407,516

(22) Filed: Apr. 4, 2003

(51) Int. Cl.$^7$ .......................... H01L 29/06; H01L 39/00
(52) U.S. Cl. .......................................... 257/30; 257/315
(58) Field of Search ........................... 257/30, 315, 326

(56) References Cited

U.S. PATENT DOCUMENTS

| | | | | |
|---|---|---|---|---|
| 4,408,303 A | * | 10/1983 | Guterman et al. | 365/185.07 |
| 5,248,624 A | * | 9/1993 | Icel et al. | 438/201 |
| 5,587,945 A | * | 12/1996 | Lin et al. | 365/185.1 |
| 5,914,514 A | | 6/1999 | Dejenfelt et al. | |
| 6,265,266 B1 | | 7/2001 | Dejenfelt et al. | |

* cited by examiner

Primary Examiner—Allan R. Wilson
(74) Attorney, Agent, or Firm—Edel M. Young; John King; Justin Liu

(57) ABSTRACT

A non-volatile memory cell incorporated in an integrated circuit is disclosed. The non-volatile memory cell comprises an access transistor; a floating gate transistor coupled to the access transistor; a tunneling capacitor formed between the source of the access transistor and the gate of the second transistor; and a coupling capacitor having a first plate associated with a gate of the floating gate transistor, the first plate being formed to minimize the gate to source capacitance of the floating gate transistor. A window is also created to reduce the capacitance of the tunneling capacitor and the gate to source capacitance of the floating gate transistor. A method of manufacturing this non-volatile memory cell is also disclosed.

30 Claims, 4 Drawing Sheets

-- PRIOR ART --

-- PRIOR ART --

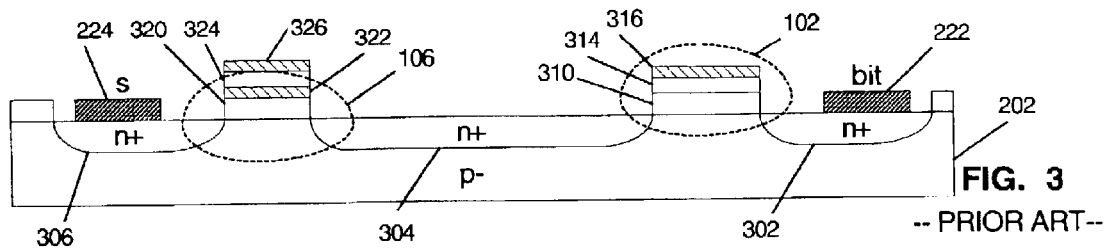
FIG. 3 -- PRIOR ART--
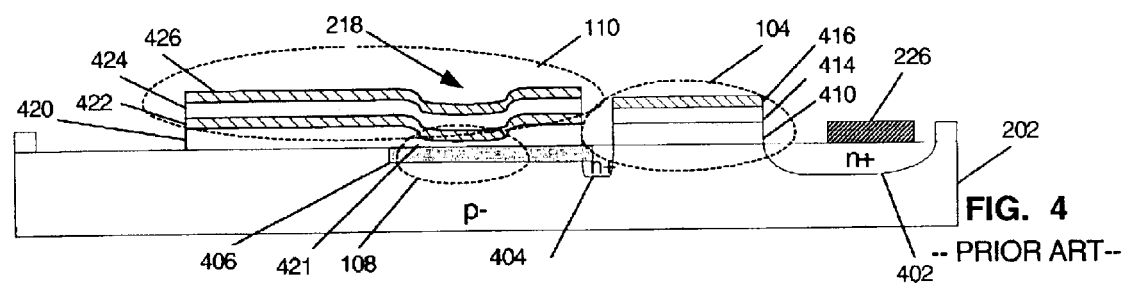
FIG. 4 -- PRIOR ART--
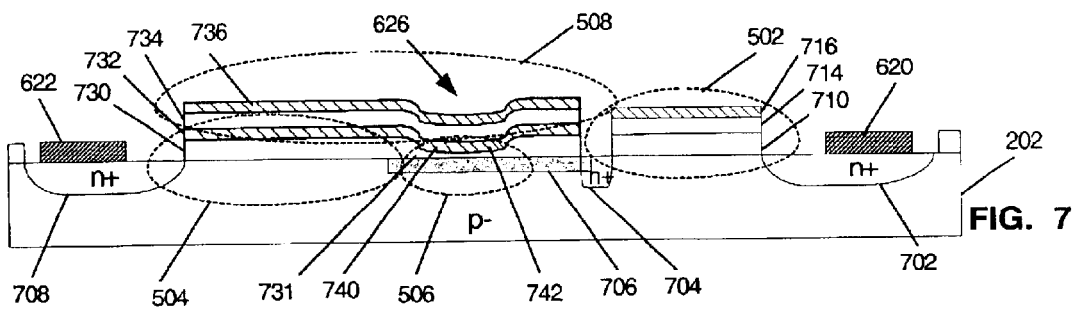
FIG. 7
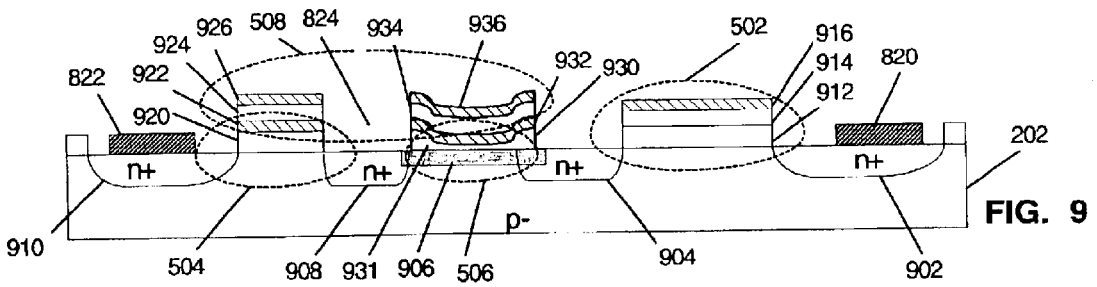
FIG. 9
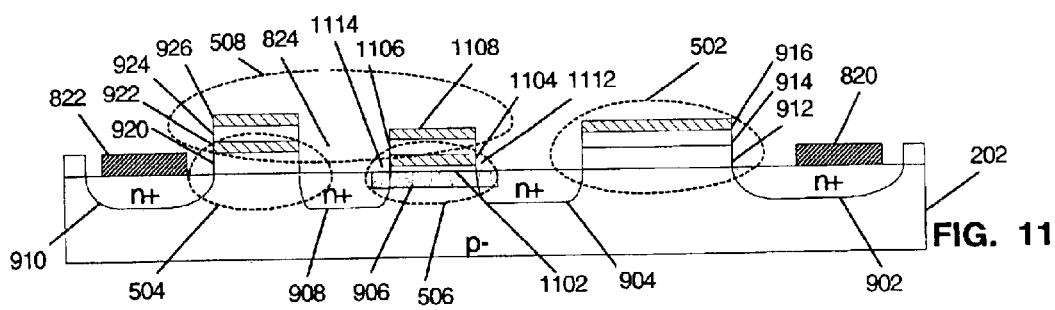
FIG. 11

NON-VOLATILE MEMORY CELL

FIELD OF THE INVENTION

The present invention relates generally to memory cells, and in particular, to a non-volatile memory cell and a method of manufacturing a non-volatile memory cell.

BACKGROUND OF THE INVENTION

Non-volatile memory is required for both field programmable gate arrays (FPGAs) and complex programmable logic devices (CPLDs). An FPGA utilizes a dedicated non-volatile memory chip for storing the bit streams required to program the FPGA. A CPLD integrates on-chip logic cores, non-volatile memory and high-voltage components to erase/program the memory. In current CPLD products, the memory cells and high-voltage components can consume up to 40% of the device silicon. Therefore, significant savings in silicon expense can be realized by reducing the memory cell size and area required by high voltage components. In integrated circuit manufacturing, even small cost reductions can open significant markets where a product is uncompetitive due to cost.

While some conventional CPLDs employ non-volatile electronically erasable (EE)-flash cells, which are small, EE-flash cells have the disadvantage of requiring both negative and positive high-voltage for program/erase. A memory cell requiring both positive and negative high voltages requires two separate charge pumps with regulation and control. This requirement increases the silicon cost for memory and support circuitry as compared to approaches with comparable cell size but requiring only a single high voltage. Further, fabricating these EE-flash cells requires one more processing step than the number of processing steps required for EE-cells requiring a single high voltage.

Similarly, some conventional memory cells, although only requiring a single, positive high voltage, have 3 transistors (i.e. 3-T memory cells). Because a 3-T memory cell has both an access transistor gate and a program/erase transistor gate, it is relatively large (~15 $\mu m^2$). To save area, the conventional memory cell shown in FIGS. 1–4 utilizes three transistors with the access and program/erase transistor gates tied together to significantly reduce the size compared to other conventional 3-T memory cells. However, many advantages of the 3-T cell are lost when the gates are tied together.

Other memory cells have only two transistors (i.e. 2-T memory cells). Although 2-T memory cells are smaller than 3-T memory cells, the switching between high-voltage for program/erase and low logic-level voltage for reading the cell must be done outside the memory cell array. However, switching large groups of cells outside the array rather than in each cell saves significant die area.

In addition to reducing the number of transistors, there are different approaches to defining a tunnel oxide etch for a memory cell which affect the size of the memory cell. By implementing a large area tunnel oxide etch, the designer achieves significantly easier alignment, easier etch control and smaller cell-size. Having less stringent alignment requirements yields less expensive masks and easier processing. However, the large tunnel oxide etch can produce a dielectric with high leakage at the metallurgical junction between the active area (also commonly called the diffusion area) and the silicon field oxide or the edge of the polysilicon. Because high leakage is detrimental to a memory cell, the tunnel oxide etch patterned area can be moved inside the active area (i.e. small tunnel oxide etch) to avoid the high-leakage region above the metallurgical junction. However, when using a small tunnel oxide etch, a smaller area opening must be patterned, and a smaller area opening is more subject to misalignment errors. Further, the cell area must be made larger to accommodate the square tunnel window inside the active area while still providing reasonable alignment tolerances.

Accordingly, there is a need for a non-volatile memory cell having a smaller area and/or improved properties, and a method of manufacturing the non-volatile memory cell.

SUMMARY OF THE INVENTION

A non-volatile memory cell incorporated in an integrated circuit is disclosed. The non-volatile memory cell comprises an access transistor; a floating gate transistor coupled to the access transistor; a tunneling capacitor formed between the source of the access transistor and the gate of the floating gate transistor; and a coupling capacitor having a first plate associated with a gate of the floating gate transistor, the first plate being formed to minimize the gate to source capacitance of the floating gate transistor. A window is also created to reduce the capacitance of the tunneling capacitor and the gate to source capacitance of the floating gate transistor.

A method of manufacturing a non-volatile memory cell incorporated in an integrated circuit is also disclosed. The method comprises the steps of creating a two transistor memory cell; creating a coupling capacitor associated with a gate of a floating gate transistor of the two transistor memory cell; and etching the coupling capacitor to minimize the capacitance of the gate to source capacitance of the floating gate transistor and tunneling capacitor capacitance.

BRIEF DESCRIPTION OF THE DRAWINGS

FIG. 3 is a cross-sectional view of the memory cell of FIG. 2 taken at line 3—3

FIG. 4 is a cross-sectional view of the memory cell of FIG. 2 taken at line 4—4

FIG. 7 is a cross-sectional view of the memory cell of FIG. 6 taken at line 7—7.

FIG. 9 is a cross-sectional view of the memory cell of FIG. 8 taken at line 9—9.

FIG. 11 is a cross-sectional view of the memory cell of FIG. 8 taken at line 11—11.

DETAILED DESCRIPTION OF THE DRAWINGS

The electronically erasable non-volatile memory cell of the present invention is a two-transistor cell that minimizes die area while maximizing coupling ratio as described in equations 1–4 below. The coupling ratio generally defines the ratio of the voltage across the coupling capacitor to the voltage across the coupling capacitor and the tunneling capacitor. That is, the coupling ratio indicates the proportion of the total voltage applied between the high and low voltage sources that is applied to the gate of the transistor of the cell being programmed. Minimizing die area lowers the die cost, which yields higher margins and/or a competitive cost advantage. A high coupling ratio means that a high proportion of the programming voltage reaches the gate being programmed, and results in lower high-voltage levels that are required to program/erase the memory cell.

One significant advantage of lowering the required high voltage level is that lower breakdown voltage transistors are required for device operation. As the breakdown voltage specification of a transistor is decreased, less process development effort is needed to develop the high-voltage transistors and to integrate the high-voltage process in the digital process flow. Reducing the breakdown voltage can significantly reduce the development cost and the time to market for entire device families. Therefore, in addition to lowering die costs, the memory cell of the present invention provides great benefits in lower process development costs.

Requiring a lower program/erase voltage level also reduces the size of charge pumps and the stress on high-voltage transistors. Charge pumps can require a significant silicon area, especially on small devices. Therefore, realizing smaller charge pumps can also yield significant savings in die cost.

As will become apparent in reference to the following figures, using the memory cell of the present invention significantly reduces the area required for memory and support circuitry as compared to conventional cells. The memory cell of the present invention minimizes die area by using a particularly efficient layout, and uses a standard MOS transistor process (in which current flows between source and drain regions through a channel) to fabricate the floating gate transistor, thereby achieving a high performance transistor in small area. The memory cell also increases the coupling ratio by reducing the area of the floating gate transistor and the tunneling capacitor, and by extending the coupling capacitor to all available area within the cell.

Figure 1:
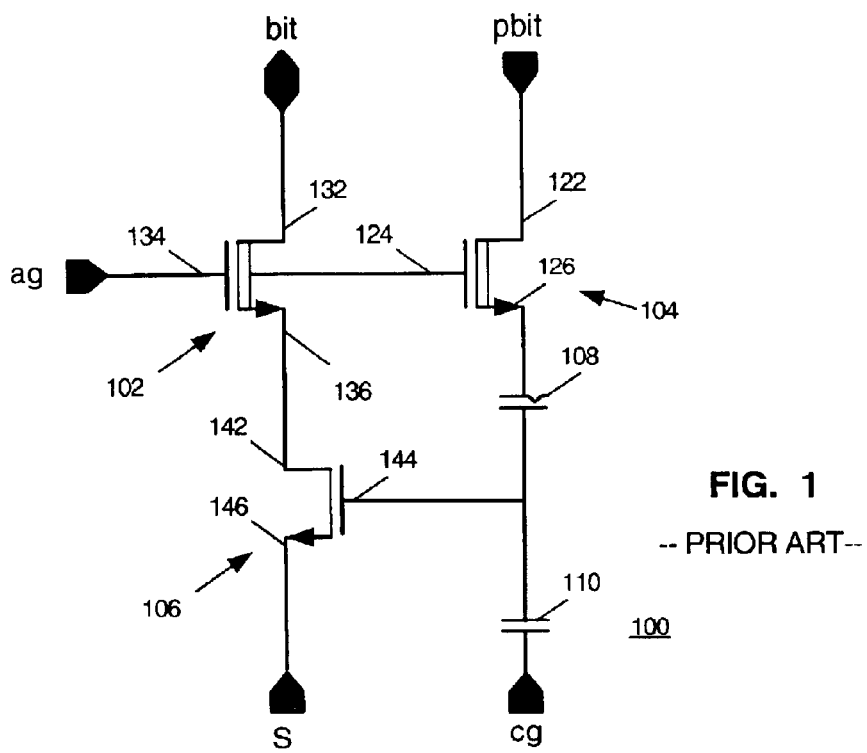
FIG. 1 is a circuit diagram of a prior art three transistor memory circuit where the access and program/erase transistor gates are connected.

Turning now to FIGS. 1–4, various views of a conventional memory cell are shown. Referring specifically to FIG. 1, a circuit of conventional memory cell 100 comprises a 3-T memory cell having an access transistor 102, a program/erase transistor 104, a floating gate transistor 106, a tunneling capacitor 108 and a coupling capacitor 110. The access transistor 102 comprises a drain 132, a gate 134 coupled to receive an access gate (ag) signal, and a source 136. The program/erase transistor 104 comprises a drain 122, a gate 124, and a source 126 coupled to the tunneling capacitor 108. The tunneling capacitor 108 is also coupled to the coupling capacitor 110 as shown in FIG. 1. With the gates connected as shown in the prior art cell of FIG. 1, the parasitics are large relative to a design having independent gates. Accordingly, a large coupling capacitor is required to overcome the large parasitic capacitance of the two transistors and the interconnect of the cell. The cell must grow to increase coupling ratio. As will be described in more detail in reference to the circuit of FIGS. 5–9, having a single active area in the memory cell of the present invention reduces the parasitic capacitance, which inherently increases the coupling ratio.

Figure 2:
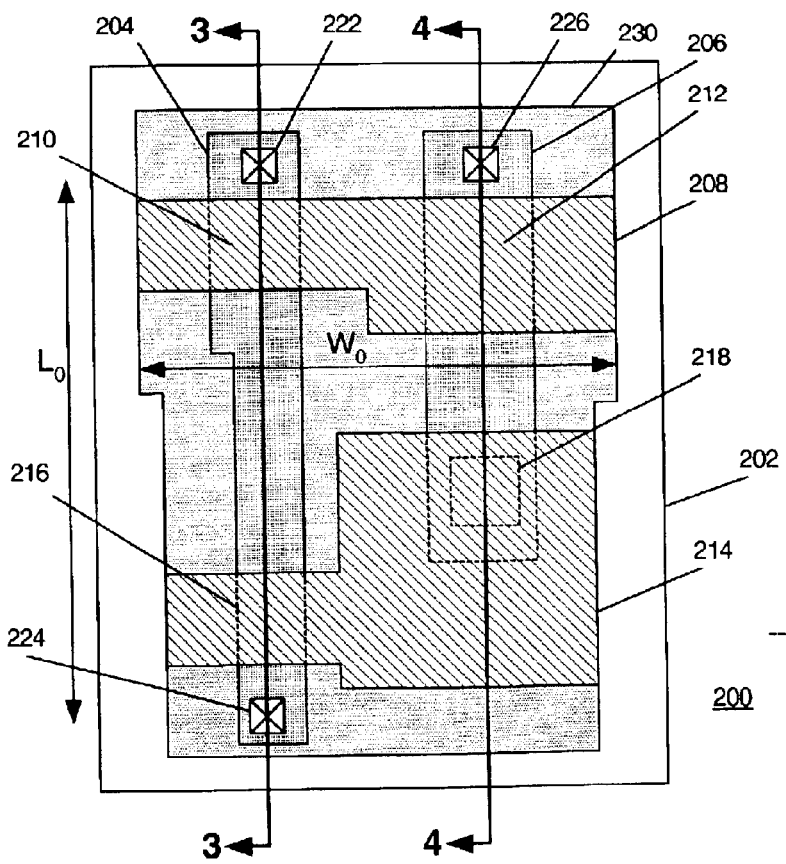
FIG. 2 is a top plan view of the memory cell implementing the circuit of FIG. 1.

Turning now to FIG. 2, a top plan view of a memory cell 200 implementing the circuit of FIG. 1 is shown. In particular, the memory cell 200 generally comprises a substrate 202, which can be made of silicon or some other semiconductor material. A first active area 204 and a second active area 206 of the memory cell are covered by a polysilicon layer 208. The polysilicon layer portion 208 defines a gate area 210 for the access transistor 102, and a gate area 212 for the program/erase transistor 104. A polysilicon layer 214 defines a gate area 216 of the floating gate transistor and a plate 218 of the tunneling capacitor 108. As will become more apparent from the cross section of FIG. 3, the polysilicon layer portion 214 generally defines a second plate of the coupling capacitor and a plate of the tunneling capacitor shown generally by region 218. Finally, a drain contact 222, a source contact 224, and a drain contact 226 are also shown. The various regions defined by the top plan view of FIG. 2 will become more apparent in the cross-sectional views shown in FIGS. 3 and 4. The dimensions of the memory cell are shown generally by the width $W_o$ and the length $L_o$.

Turning now to FIG. 3, a cross-sectional view of the memory cell of FIG. 2 taken at line 3—3 is shown. In particular, a number of diffused regions in the memory cell include a doped region 302, a doped region 304, and a doped region 306. The doped regions shown in FIG. 3 can be formed by any conventional doping technique known in the art of integrated circuit manufacturing. The access transistor 102 comprises a gate having silicon dioxide layer portions 310 and 314 which together form a thick oxide layer and are covered by a polysilicon layer portion 316 (of polysilicon layer 208 shown in FIG. 2). The gate controls current between the doped regions 302 and 304, as is well known in the art. Similarly, the floating gate transistor 106 comprises a gate having a silicon dioxide layer portion 320, and a polysilicon layer portion 322. The gate generally controls the current between doped regions 304 and 306, as is well known in the art. Finally, the polysilicon layer portion 322, the silicon dioxide layer portion 324 and the polysilicon layer portion 326 form the coupling capacitor.

Turning now to FIG. 4, a cross-sectional view of the memory cell of FIG. 2 taken at lines 4—4 is shown. In particular, doped regions 402 and 404, and heavily doped region 406 are shown formed in the memory cell. The program/erase transistor 104 comprises a gate having a silicon dioxide layer portion 410, a silicon dioxide layer portion 414, and a polysilicon layer portion 416 (of polysilicon layer 208 shown in FIG. 2). The gate of transistor 104 generally controls the current between the doped regions 402 and 404, as is well known in the art. The tunneling capacitor 108 and coupling capacitor 110 are created using various layers of silicon dioxide and polysilicon. In particular, the coupling capacitor 110 is formed by a polysilicon layer portion 422, a silicon dioxide layer portion 424, and a polysilicon layer portion 426 (of polysilicon layer 214 shown in FIG. 2). Similarly, the tunneling capacitor 108 is created by the polysilicon layer portion 422, the silicon dioxide layer portion 420 (having a well 421) and the heavily doped region 406. Because the tunneling capacitor is formed by a small area etch which creates the well 421 for a plate of the tunneling capacitor, the resulting tunneling capacitor is not well controlled. That is, because the well has rounded edges, the dimensions of the portion of the polysilicon layer portion 422 forming the plate of the tunneling capacitor are not always uniform.

It should be noted that the various layers shown in the cross sections of FIGS. 3 and 4 are formed in the same layer, as is well known in the art of semiconductor fabrication. For example, within FIG. 3 silicon dioxide layer portions 310 and 320 are formed in the same layer, silicon dioxide layer portions 314 and 324 are formed in the same layer, and polysilicon layer portions 316 and 326 are formed in the same layer, etc. Similarly, various layer portions of FIG. 3 correspond to layer portions of FIG. 4. For example, layer portions 320, 322, 324 and 326 correspond to layer portions 420, 422, 424, and 426, respectively.

Figure 5:
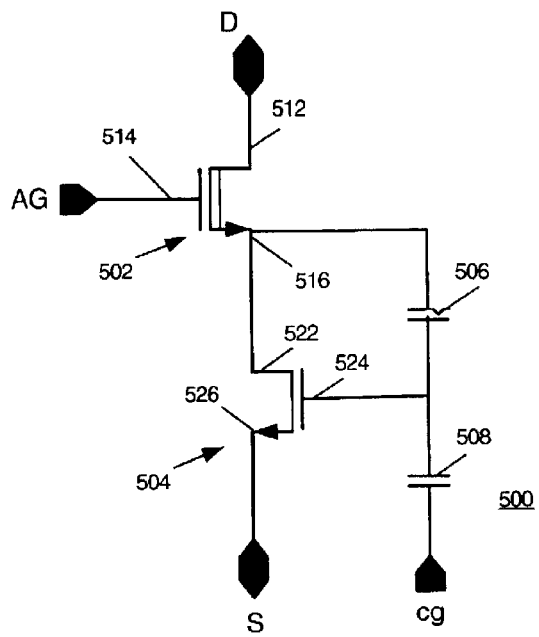
FIG. 5 is a circuit diagram of a two transistor memory circuit according to the present invention.
Figure 6:
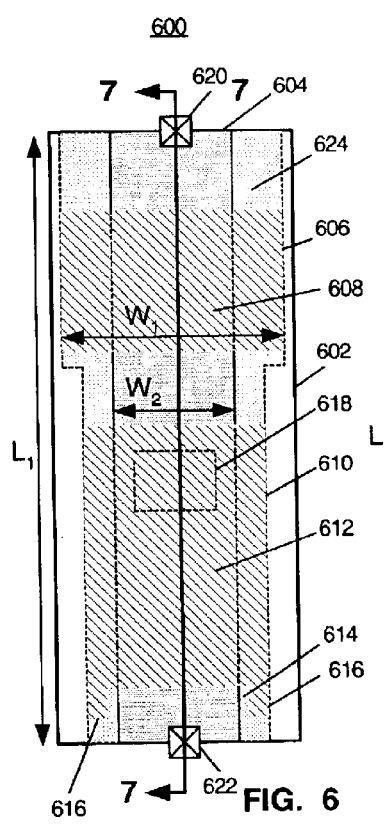
FIG. 6 is a top plan view of a memory circuit of FIG. 5 according to the present invention.

Turning now to FIGS. 5–7, a memory cell according to a first embodiment of the invention is shown. Referring specifically to FIG. 5, a circuit diagram of a 2-T memory cell circuit shows a combined access and program/erase transistor 502 coupled to a floating gate transistor 504, a tunneling capacitor 506 and a coupling capacitor 508. Transistor 502 comprises a drain 512, a gate 514, and a source 516. The transistor 504 comprises a drain 522 coupled to the source 516, a gate 524 and a source 526.

Turning now to FIG. 6, a top plan view of a memory cell implementing the circuit of FIG. 5 according to one embodiment of the present invention is shown. In particular, a memory cell 600 comprises a substrate 602 having an active area 604. A polysilicon layer 606 defines a gate area 608 of the transistor 502. A polysilicon layer 610 defines a floating gate area 612, while an etched portion 614 defines a pair of feet 616. As will be described in more detail later, the etched portion 614 and feet 616 increase the coupling ratio by increasing the capacitance of the coupling capacitor while minimizing the gate-source capacitance of the floating gate transistor. An oxide etch area 618 defines an area that the oxide will be etched to create a plate associated with a polysilicon layer for the tunneling capacitor. Finally, a drain contact 620 and a source contact 622 are shown. The dimensions of the memory cell 600 are generally defined by dimensions $L_1$ and $W_1$. The width $W_2$ of the active region 604 will be used to show differences in coupling ratios of the various embodiments of the present invention. However, the overall size of the memory cell of FIG. 6 is approximately half the size of the memory cell of FIG. 2. That is, $W_1$ is approximately one half of $W_0$.

Turning now to FIG. 7, a cross-sectional view of the memory cell of FIG. 6 taken at line 7—7 is shown. In particular, doped regions 702, 704, and 708 and highly doped region 706 are formed in the substrate 202. The transistor 502 comprises a gate having a silicon dioxide layer portion 710, a silicon dioxide layer portion 714, and the polysilicon layer portion 716. The gate controls the current between the doped region 702 and the doped region 704. The floating gate transistor 504 is creating by forming a gate having a silicon dioxide layer portion 730 and a polysilicon layer portion 732 forming a floating gate. The tunneling capacitor is created by the polysilicon layer portion 732, the silicon dioxide layer portion 730 (having a well 731) and the heavily doped region 706. Similarly, the coupling capacitor 508 is created by the polysilicon layer portion 732, the silicon dioxide layer portion 734 and the polysilicon layer portion 736.

The embodiments of FIGS. 6–11 are formed using the same processing steps as will be apparent in the various cross sections. In particular, after the appropriate doped regions are formed, a first silicon dioxide layer is applied. The first silicon dioxide layer is then etched by a first etching step to create a thin oxide layer. This etching step may be a small tunnel etch, for example as shown and described with respect to FIG. 9, or a large tunnel etch, as shown and described with respect to FIG. 11. A first polysilicon layer is then applied. A portion of the polysilicon layer is then removed in the gate area of transistor 502 by a second etching step. A second silicon dioxide layer and second polysilicon layer are then applied. Finally, a third etching step is then performed to define part or all of the transistor gates and capacitors, as will be described.

Although the embodiment of FIGS. 6–7 is significantly smaller than the prior art, the memory cell can still be made smaller and manufactured with fewer processing steps. Memory cell 600 has a floating gate transistor gate that is patterned by two different masking steps, which makes the gate length highly variable with process variations and from die to die. That is, the oxide etch and tunnel implant patterning steps actually pattern the floating gate transistor, and using these two different process steps to form this transistor results in both a highly variable gate length and a large area transistor, which decreases coupling ratio. It is noted that the large cell size is partly due to compensating for the leaky dielectric by forming the tunneling capacitor in the active area, and partly due to increasing the coupling capacitor size to increase the coupling ratio.

Figure 8:
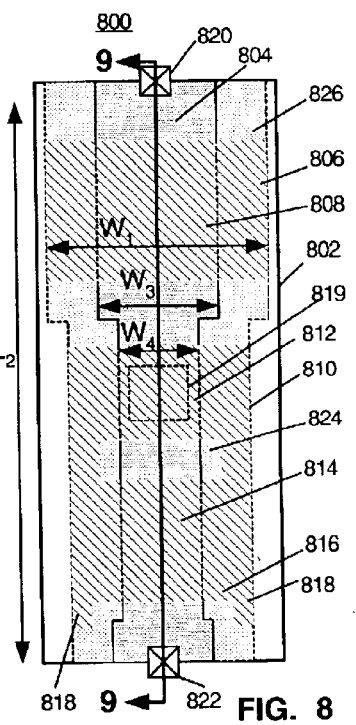
FIG. 8 is a top plan view of a memory circuit of FIG. 5 showing a small area etch according to an alternative embodiment of the present invention.

Accordingly, an alternative embodiment of FIGS. 8 and 9 provides a further reduction in size of the memory cell, improved gate length control, improved coupling ratio, and improved floating gate transistor performance. A window is created in the memory cell to reduce the floating gate transistor size. Reducing the floating gate transistor size has the advantages of lower-resistance switching and increased coupling ratio. Because one mask step is used to define the floating gate transistor gate length according to a standard transistor formation process, well-controlled gate length and high performance are realized.

Figure 10:
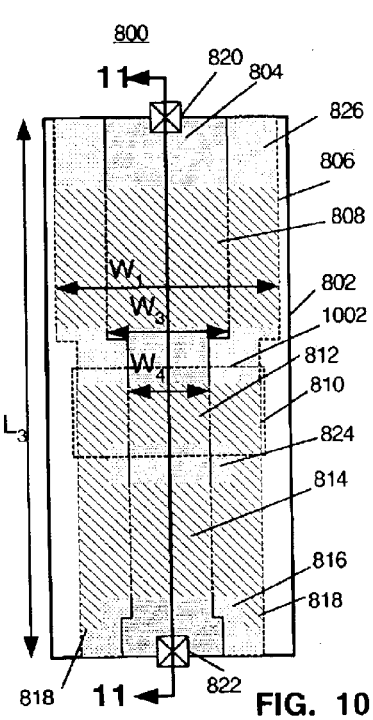
FIG. 10 is a top plan view of a memory circuit of FIG. 5 showing a large area etch according to an alternative embodiment of the present invention.

An additional benefit of the embodiment of FIGS. 10 and 11 is that this embodiment uses a large area etch, and thus the process scales more easily due to the reduced number of features in the layout as compared to a 3-T cell. Further, with this embodiment, it is easier to convert between different methods of defining the tunneling capacitor area as process development of low-leakage dielectric etches matures.

Turning now to FIG. 8, a top plan view of a memory cell of FIG. 5 according to an alternative embodiment of the present invention is shown. In particular, memory cell 800 comprises a substrate 802 having an active area 804. A polysilicon layer 806 defines a gate area 808 of the transistor 502. A polysilicon layer 810 defines a tunneling capacitor plate area 812, a floating gate area 814 of the transistor 504 and a plate of capacitor 508. An etched portion 816 defines a plurality of feet 818. A region 819 defining a small area etch is also shown. The effect of using a small area etch on the size of the cell will be described in reference to FIG. 10. A drain contact 820 and a source contact 822 are shown. Finally, a window area 824 is formed between the tunneling capacitor and the floating gate transistor 504.

Because the window is formed with a single etch step, the tunneling capacitor and the floating gate transistor are formed with a hard etch with well controlled lines, thereby improving the coupling ratio and reducing the size of the memory cell. Further, the well controlled lines of the tunneling capacitor and the floating gate transistor allow a smaller memory cell to be manufactured. That is, because the coupling ratio is improved and the transistor size is precisely controlled, the width of the active region in the area of the tunneling capacitor can be reduced from a width of $W_2$ to a width of $W_4$. Similarly, the length of the overall cell can be decreased from a length $L_1$ to $L_2$ because the length of the floating gate can be decreased. The improvements of the embodiment of FIG. 8 will become more apparent in reference to the cross section of FIG. 9.

Turning now to FIG. 9, a cross-sectional view of the memory cell of FIG. 8 taken at line 9—9 is shown. In particular, doped regions 902, 904, 908 and 910 and highly doped region 906 are formed in the substrate 202. A gate of transistor 502 is formed by silicon dioxide layer portions 912 and 914, and a polysilicon layer portion 916. The gate controls the flow of current between diffused regions 902 and 904. The second transistor 504 is formed by a silicon dioxide layer portion 920 and a polysilicon layer portion 922 comprising a floating gate. Accordingly, the floating gate created by the polysilicon layer portion 922 controls the current in the doped regions 908 and 910, as is well known in the art. The tunneling capacitor 506 is formed by the polysilicon layer portion 932, the silicon dioxide portion 930 (having a well 931), and the highly doped region 906. The polysilicon layer 932, along with silicon dioxide layer 934 and polysilicon layer 936, forms part of the coupling capacitor.

One important feature of the embodiment of FIG. 9 is that forming the window 824 enables both source and drain of transistor 504 to be formed by standard transistor processing steps. That is, unlike transistor 504 of FIG. 7 in which the drain is defined by the heavily doped region 706, the creation of window 824 enables the formation of the floating gate transistor by a standard transistor formation process having a well defined gate. As shown in the cross section of FIG. 9, the use of a small area etch creates a tunneling capacitor (defined by etch region 819 shown in FIG. 8). However, a tunneling capacitor is more difficult to define using a small area etch due to the well 931. Also, the fact that the polysilicon layer portion 932 is not planar makes the capacitance less controllable than a planar capacitor would be.

Turning now to FIGS. 10 and 11, the benefits of employing a large area etch and the resulting decrease in size of the memory cell will be described. By employing a large area etch as shown by the large area etch region 1002 in FIG. 10, the tunneling capacitor 506 is formed by first thinning the silicon dioxide layer portion 1102, and then a controlled etch of the silicon dioxide layer portion 1102, the polysilicon layer portion 1104, the silicon dioxide layer portion 1106, and the polysilicon layer portion 1108, creating the window 824 and well defined walls 1112 and 1114, shown in FIG. 11. A first etch step creates the relatively thin oxide of silicon dioxide layer portion 920, defined by the region 1002. A second etch eliminates portions of the polysilicon layer 922 associated with the transistor 502. That is, the polysilicon layer 922 is etched in the gate region of transistor 502 and second silicon dioxide layer portion 914 is deposited, leaving only the thick oxide layer formed by the combination of silicon dioxide layer portions 912 and 914. The silicon dioxide layer portion 920, the polysilicon layer portion 922, the silicon dioxide layer portion 924, and the polysilicon layer portion 926 are then etched to form the tunneling capacitor plate and the floating gate of the tunneling capacitor and the floating gate transistor, respectively, (as well as the gate of transistor 502 including silicon dioxide layers 912 and 914 and polysilicon layer 916) by a third controlled etch. That is, the third etch etches both the silicon dioxide layer portion 920, the polysilicon layer portion 922, the silicon dioxide layer portion 924, and the polysilicon layer portion 926. As set forth above, the controlled etch creates a capacitor plate of the tunneling capacitor having more precisely controlled dimensions, and therefore creates a more uniform tunneling capacitor. Similarly, the transistor 504 of FIG. 11 also has a more precisely controlled gate because it is formed by a standard transistor forming process. That is, the gate of transistor 504 is formed by hard etching (as defined by window 824 shown in FIG. 9 rather than the well 731 of FIG. 7). Finally, because a large area etch is used, the overall length of the memory cell of FIGS. 10 and 11 is reduced from $L_2$ to $L_3$.

The etched areas and window described in FIGS. 5–11 improve the coupling ratio by reducing the tunneling capacitor and the floating gate capacitor, as shown by the equation below.

$$CPR = \frac{C_{cg}}{C_{cg} + C_{fg} + C_{tc}} \quad \text{Eq. 1}$$

$$= \frac{A_{cg}/t_{cg}}{A_{cg}/t_{cg} + A_{fg}/t_{fg} + A_{tc}/t_{tc}} \quad \text{Eq. 2}$$

$$= \frac{A_{cg}}{A_{cg} + A_{fg}\frac{t_{cg}}{t_{fg}} + A_{tc}\frac{t_{cg}}{t_{tc}}} \quad \text{Eq. 3}$$

$$\frac{t_{cg}}{t_{fg}} \approx \frac{t_{cg}}{t_{tc}} \approx 2 \quad \text{Eq. 4}$$

where "CPR" represents coupling ratio, "C" represents capacitance, "A" represents area, and "t" represents thickness; and "cg" represents the coupling capacitor, "fg" represents the floating gate and "tc" represents the tunneling capacitor.

To make CPR approach 1.0, $C_{cg}$ is made large, or both floating gate transistor and tunneling capacitor are made small. As described above, the various embodiments of the present invention reduces the area of the floating gate and the tunneling capacitor to increase the coupling ratio. Further, by patterning and etching the coupling capacitor to create the etched area and feet, the coupling capacitance $C_{cg}$ is increased without making the memory cell larger.

Figure 12:
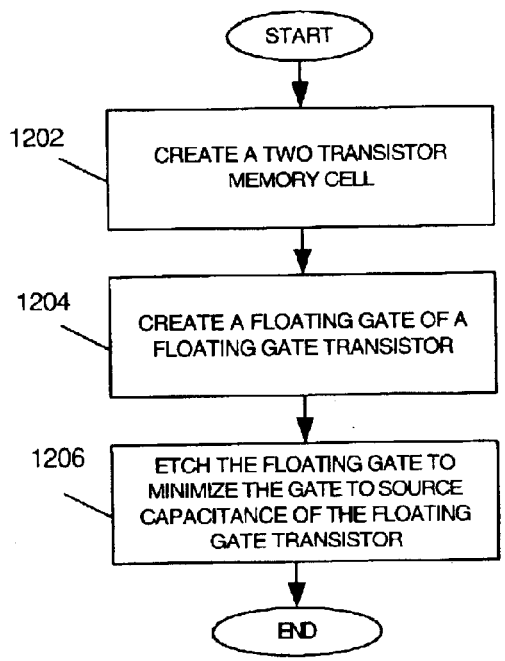
FIG. 12 is a flowchart showing a method of manufacturing a nonvolatile memory cell according to the present invention.

Turning now to FIG. 12, a flowchart shows a method of manufacturing a nonvolatile memory cell according to the present invention. At step 1202, a two transistor memory cell is created. At step 1204, floating gate of the floating gate transistor of the memory cell is created. At step 1206, the floating gate is etched to minimize the gate to source capacitance of the floating gate transistor. For example, the etching can create an etched portion 614 and feet 616 as shown in FIG. 6 or an etched portion 816 and feet 818 as shown in FIG. 8 or 10.

Figure 13:
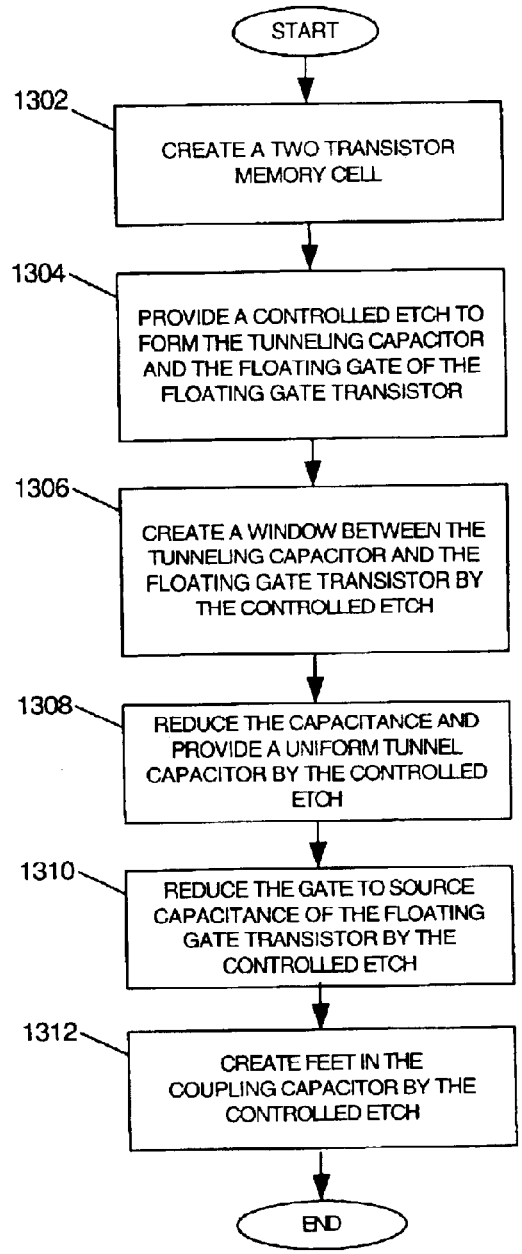
FIG. 13 is a flowchart showing a method of manufacturing a nonvolatile memory cell according to an alternative embodiment of the present invention.

Turning now to FIG. 13, a flowchart shows a method of manufacturing a nonvolatile memory cell according to an alternative embodiment of the present invention. Such a flowchart can be employed to create the memory cell of FIG. 8 or 10, for example. At step 1302, a two transistor cell is created. At step 1304, a controlled etch is provided to form the tunneling capacitor and the floating gate of the floating gate transistor. At step 1306, a window is created by the controlled etch to form a tunneling capacitor plate and the floating gate of the floating gate transistor. At step 1308, the capacitance of the tunneling capacitor is reduced by the controlled etch, while a more uniform tunneling capacitor is created by the controlled etch. At step 1310, the gate to source capacitance of the floating gate transistor is also reduced by the controlled etch. In addition to creating the window 824, at step 1312, the etched portion 816 and feet 818 can be created by the second controlled etch. The feet increase the capacitance of the coupling capacitor without increasing the area of the memory cell.

The disclosed electronically erasable non-volatile memory cell of the present invention provides a more cost competitive and higher speed memory cell. Lower cost is realized by requiring a smaller die area and reducing the engineering effort that is needed to develop the high-voltage transistors. For example, reducing the voltage of the high voltage transistors reduces the required gate dielectric breakdown and the required channel breakdown voltages, and therefore improves speed and transconductance. In small CPLDS, the memory cell and high-voltage source can be up to 40% of the die size, and decreasing the memory cell size and the high-voltage support circuitry according to the present invention can yield a die size reduced by up to 10–15%. Smaller die size reduces die cost both by saving silicon area and by increasing yield. In addition, smaller die size will yield higher speed parts, especially large CPLD parts. In particular, a faster part can be realized due to decreased propagation delays realized with a smaller die size (i.e. routing delays are smaller). Savings in engineering costs for developing high-voltage transistors can be significant.

Because logic circuitry is shrinking much more quickly than high-voltage and EE-cell technology, the area for EE-cells and support circuitry will grow to an even greater fraction of the die area in future generations. Therefore, shrinking the EE-cell will be even more beneficial in future. The EE-cell presented here greatly reduces the die area required and the voltage required to program and erase the EE-cell as compared to prior art devices.

It will be appreciated by those skilled in the art that, given the teaching herein, numerous alternatives and equivalents will be seen to exist which incorporate the disclosed invention. For example, other similar integrated circuit fabrication processes and alternative layout arrangements can be used. As a result, the invention is not to be limited by the foregoing embodiments, but only by the following claims.

What is claimed is:

1. A non-volatile memory cell incorporated in an integrated circuit comprising:
    an access transistor formed on a diffusion area;
    a floating gate transistor coupled to said access transistor and formed on said diffusion area;
    a tunneling capacitor formed between the source of said access transistor and the gate of said floating gate transistor; and
    a coupling capacitor having a first plate associated with a gate of said floating gate transistor, said first plate being formed to minimize the gate to source capacitance of said floating gate transistor.

2. The non-volatile memory cell of claim 1 wherein said first plate has an etched area.

3. The non-volatile memory cell of claim 2 wherein said etched area creates a pair of feet.

4. The non-volatile memory cell of claim 1 wherein said tunneling capacitor is formed by a controlled etch.

5. The non-volatile memory cell of claim 4 further comprising a window formed by said controlled etch to reduce the capacitance of said tunneling capacitor and the gate to source capacitance of said floating gate transistor.

6. An integrated circuit incorporating a non-volatile memory cell, the non-volatile memory cell comprising:
    an access transistor formed on a diffusion area;
    a floating gate transistor coupled to said access transistor and formed on said diffusion area; and
    a tunneling capacitor formed between the source of said access transistor and the gate of said floating gate transistor, said tunneling capacitor being etched by a controlled etch.

7. The circuit of claim 6 further comprising a coupling capacitor associated with a gate of said floating gate transistor.

8. The circuit of claim 7 further comprising a window formed in said memory cell by a controlled etch.

9. The circuit of claim 8 wherein said window reduces the capacitance of said tunneling capacitor and the gate to source capacitance of said floating gate transistor.

10. The circuit of claim 6 wherein a floating gate of said floating gate transistor is etched to minimize the gate to source capacitance of said floating gate transistor.

11. A non-volatile memory cell incorporated in an integrated circuit comprising:
    an access transistor formed on a diffusion region;
    a floating gate transistor coupled to said access transistor and formed on said diffusion region;
    a tunneling capacitor formed between the source of said access transistor and the gate of said floating gate transistor, said tunneling capacitor being etched by a controlled etch; and
    a coupling capacitor having a first plate associated with a gate of said floating gate transistor, said coupling capacitor being etched by said controlled etch to form a pair of feet.

12. A non-volatile memory cell incorporated in an integrated circuit comprising:
    an access transistor;
    a floating gate transistor coupled to said access transistor;
    a tunneling capacitor formed between the source of said access transistor and the gate of said floating gate transistor, said tunneling capacitor being etched by a controlled etch; and
    a coupling capacitor having a first plate associated with a gate of said floating gate transistor, said coupling capacitor being etched by said controlled etch to form a pair of feet to decrease the area of the gate of the floating gate transistor.

13. The circuit of claim 12 wherein the width of the gate of said floating gate transistor is less than the width of the gate of said access transistor.

14. The circuit of claim 11 further comprising a window formed by said controlled etch.

15. The circuit of claim 14 wherein said window reduces the gate to source capacitance of said floating gate transistor and the capacitance of the tunneling capacitor.

16. An integrated circuit incorporating a non-volatile memory cell, the non-volatile memory cell comprising:
    an access transistor;
    a floating gate transistor coupled to said access transistor;
    a tunneling capacitor formed between the source of said access transistor and the gate of said floating gate transistor, said tunneling capacitor being etched by a controlled etch;
    a coupling capacitor having a first plate associated with a gate of said floating gate transistor; and
    a window formed between said tunneling capacitor and said floating gate transistor, said window reducing the gate to source capacitance of said floating gate transistor and the capacitance of said tunneling capacitor.

17. The circuit of claim 16 wherein said first plate is etched to minimize the gate to source capacitance of said floating gate transistor.

18. The circuit of claim 16 wherein said coupling capacitor is etched to include feet to increase the coupling capacitance of the coupling capacitor.

19. An integrated circuit incorporating a non-volatile memory cell, the non-volatile memory cell comprising:
   an access transistor;
   a floating gate transistor coupled to said access transistor, wherein the width of the gate of said floating gate transistor is less than the width of the gate of said access transistor;
   a tunneling capacitor formed between the source of said access transistor and the gate of said floating gate transistor, said tunneling capacitor being etched by a controlled etch;
   a coupling capacitor having a first plate associated with a gate of said floating gate transistor; and
   a window formed between said tunneling capacitor and said floating gate transistor, said window reducing the gate to source capacitance of said floating gate transistor and the capacitance of said tunneling capacitor.

20. An integrated circuit incorporating a non-volatile memory cell, the non-volatile memory cell comprising:
   an access transistor:
   a floating gate transistor coupled to said access transistor;
   a tunneling capacitor formed between the source of said access transistor and the rate of said floating rate transistor, said tunneling capacitor being etched by a controlled etch, wherein the width of the tunneling capacitor is less than the width of the gate of said access transistor;
   a coupling capacitor having a first plate associated with a gate of said floating gate transistor; and
   a window formed between said tunneling capacitor and said floating gate transistor, said window reducing the gate to source capacitance of said floating gate transistor and the capacitance of said tunneling capacitor.

21. A layout for a non-volatile memory cell comprising:
   an active region associated with an access transistor and a floating gate transistor;
   a silicon dioxide layer formed on said active area;
   a coupling capacitor having a first plate and a second plate associated with a gate of said floating gate transistor; and
   an etched region through said coupling capacitor and said silicon dioxide layer at said gate of said floating gate transistor.

22. The layout for a non-volatile memory cell of claim 21 wherein said silicon dioxide layer comprises a thin oxide area.

23. The layout for a non-volatile memory cell of claim 22 wherein said thin oxide area comprises a well.

24. The layout for a non-volatile memory cell of claim 22 further comprising a tunneling capacitor formed on said thin oxide area.

25. The layout for a non-volatile memory cell of claim 24 further comprising a window formed between said gate of said floating gate transistor and said tunneling capacitor.

26. A layout for a non-volatile memory cell comprising:
   an active region associated with an access transistor and a floating gate transistor;
   a silicon dioxide layer formed on said active region and having a thin oxide area;
   a tunneling capacitor having a plate formed on said thin oxide area;
   a coupling capacitor coupled to said tunneling capacitor and having a first plate and a second plate associated with said gate of said floating gate transistor; and
   a window formed between said floating gate transistor and said tunneling capacitor.

27. The layout for a non-volatile memory cell of claim 26 wherein said thin oxide area comprises a well.

28. A layout for a non-volatile memory cell comprising:
   an active region associated with an access transistor and a floating gate transistor;
   a silicon dioxide layer formed on said active region and having a thin oxide area;
   a tunneling capacitor having a plate formed on said thin oxide area, wherein said thin oxide layer is a layer of uniform thickness in said tunneling capacitor;
   a coupling capacitor coupled to said tunneling capacitor and having a first plate and a second plate associated with said gate of said floating gate transistor; and
   a window formed between said floating gate transistor and said tunneling capacitor.

29. The layout for a non-volatile memory cell of claim 26 wherein said tunneling capacitor is formed by a controlled etch through said thin oxide layer.

30. A layout for a non-volatile memory cell comprising:
   an active region associated with an access transistor and a floating gate transistor;
   a silicon dioxide layer formed on said active region and having a thin oxide layer;
   a tunneling capacitor formed on said thin oxide layer by a controlled etch through a plate of said tunneling capacitor and said thin oxide layer;
   a coupling capacitor having a first plate and a second plate associated with said gate of said floating gate transistor;
   a window formed at a first side of said gate between said gate of said floating gate transistor and said tunneling capacitor; and
   an etched region through said coupling capacitor and said silicon dioxide layer at a second side of said gate of said floating gate transistor.

* * * * *

UNITED STATES PATENT AND TRADEMARK OFFICE
CERTIFICATE OF CORRECTION

| | | |
|---|---|---|
| PATENT NO. | : 6,822,254 B1 | Page 1 of 1 |
| APPLICATION NO. | : 10/407516 | |
| DATED | : November 23, 2004 | |
| INVENTOR(S) | : Michael L. Lovejoy | |

It is certified that error appears in the above-identified patent and that said Letters Patent is hereby corrected as shown below:

Title Page, Item (54) and in the specification, Column 1, Line 1, Title,
"NON-VOLATILE MEMORY CELL" should read --NON-VOLATILE MEMORY CELL AND METHOD OF MANUFACTURING A NON-VOLATILE MEMORY CELL--

Title Page, Item (73) Assignee should read --Xilinx, Inc., San Jose, CA (US)--

Signed and Sealed this
Thirteenth Day of August, 2013

Teresa Stanek Rea
*Acting Director of the United States Patent and Trademark Office*